(12) United States Patent
Chen

(10) Patent No.: US 9,385,741 B2
(45) Date of Patent: Jul. 5, 2016

(54) DIGITAL-TO-ANALOG CONVERSION APPARATUS FOR GENERATING COMBINED ANALOG OUTPUT BY COMBINING ANALOG OUTPUTS DERIVED FROM USING DIFFERENT SAMPLING CLOCKS AND RELATED METHOD THEREOF

(71) Applicant: MEDIATEK INC., Hsin-Chu (TW)

(72) Inventor: Chih-Jung Chen, Hsinchu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/538,814

(22) Filed: Nov. 12, 2014

(65) Prior Publication Data

US 2016/0118996 A1    Apr. 28, 2016

Related U.S. Application Data

(60) Provisional application No. 62/068,775, filed on Oct. 27, 2014.

(51) Int. Cl.
  *H03M 1/06* (2006.01)
  *H03M 1/66* (2006.01)

(52) U.S. Cl.
  CPC .............. *H03M 1/66* (2013.01); *H03M 1/0626* (2013.01)

(58) Field of Classification Search
  CPC ..... H03M 1/66; H03M 1/662; H03M 1/0629; H03M 1/1009; H03M 1/1033; H03M 1/0695; H03M 1/168; H03M 1/0626
  USPC ......... 341/118, 144, 143, 145, 146, 147, 148; 375/371, 347, 244, 322; 370/524, 355, 370/342, 350, 441
  See application file for complete search history.

(56) References Cited

U.S. PATENT DOCUMENTS

| 6,150,970 | A | 11/2000 | Anagnos |
| 6,897,795 | B2 | 5/2005 | Mallinson |
| 6,987,475 | B2 | 1/2006 | Mallinson |
| 8,502,720 | B1* | 8/2013 | Wyville ............... H03M 1/0629 341/143 |
| 2012/0105264 | A1* | 5/2012 | Ryu ....................... H03M 1/002 341/161 |
| 2014/0269650 | A1* | 9/2014 | Sahota ................... H04W 84/12 370/338 |

OTHER PUBLICATIONS

Jurgen Deveugele et al., Parallel-Path Digital-to-Analog Converters for Nyquist Signal Generation, IEEE Journal of Solid-State Circuits, vol. 39, No. 7, Jul. 2004, pp. 1073-1082, XP011114656.

(Continued)

*Primary Examiner* — Lam T Mai
(74) *Attorney, Agent, or Firm* — Winston Hsu; Scott Margo

(57) ABSTRACT

A digital-to-analog conversion apparatus has a first digital-to-analog converter, at least one second digital-to-analog converter, and a combining circuit. The first digital-to-analog converter is arranged to receive a first sampling clock and a digital input, and convert the digital input into a first analog output according to the first sampling clock. The at least one second digital-to-analog converter is arranged to receive the digital input and at least one second sampling clock different from the first sampling clock, and convert the digital input into at least one second analog output according to the at least one second sampling clock. The combining circuit is arranged to combine the first analog output and the at least one second analog output into a combined analog output of the digital input.

18 Claims, 8 Drawing Sheets

(56) References Cited

OTHER PUBLICATIONS

S. Balasubramanian et al., Systematic Analysis of Interleaved Digital-to-Analog Converters, IEEE Transactions on Circuits and Systems-II: Express Briefs, vol. 58, No. 12, Dec. 2011, pp. 882-886, XP011391154.

Paul T. M. Van Zeijl et al., On the Attenuation of DAC Aliases Through Multiphase Clocking, IEEE Transactions on Circuits and Systems-II: Express Briefs, vol. 56, No. 3, Mar. 2009, pp. 190-194, XP011253561.

Anuranjan Jha et al., Wideband Signal Synthesis Using Interleaved Partial-Order Hold Current-Mode Digital-to-Analog Converters, IEEE Transactions on Circuits and Systems-II: Express Briefs, vol. 55, No. 11, Nov. 2008, pp. 1109-1113, XP011239611.

\* cited by examiner

DIGITAL-TO-ANALOG CONVERSION APPARATUS FOR GENERATING COMBINED ANALOG OUTPUT BY COMBINING ANALOG OUTPUTS DERIVED FROM USING DIFFERENT SAMPLING CLOCKS AND RELATED METHOD THEREOF

CROSS REFERENCE TO RELATED APPLICATIONS

This application claims the benefit of U.S. provisional application No. 62/068,775, filed on Oct. 27, 2014 and incorporated herein by reference.

BACKGROUND

The disclosed embodiments of the present invention relate to converting an input signal in a digital domain into an output signal in an analog domain, and more particularly, to a digital-to-analog conversion apparatus for generating a combined analog output by combining analog outputs derived from using different sampling clocks and a related method thereof.

A digital-to-analog converter (DAC) is used to convert a discrete digital input data into a continuous analog output, and is widely used in a variety of applications. However, since the DAC converts the discrete sampling digital impulse data to the continuous analog waveform, the continuous analog output of a DAC is more typically a zero-order hold series of stair steps. This transformation from discrete sampling impulse to continuous stair steps will induce the high frequency image signal. If the digital output signal frequency is Fo, and the sampling frequency is Fs, these images are located at N*Fs+M*Fo, where N=1, 2, 3, ... and M=+/−1, and have no external filtering image amplitude roll-off as $\sin(x)/x$ where x=pi*Fo/Fs. Thus, it is required to alleviate/eliminate the undesired images to prevent other circuit elements from being affected by the undesired images. One possible solution is to use a higher-order post-DAC filter for offering good image rejection. However, such a design would increase the production cost inevitably. Another possible solution is to increase the sampling frequency of the DAC to move the undesired images to higher frequencies for allowing the use of a lower-order post-DAC filter to remove the undesired images. However, such a design is not easy to be implemented when sampling frequency is more than several hundred million hertz.

Thus, there is a need for an innovative DAC system which is capable of offering good image rejection while using a lower-order post-DAC filter.

SUMMARY

In accordance with exemplary embodiments of the present invention, a digital-to-analog conversion apparatus for generating a combined analog output by combining analog outputs derived from using different sampling clocks and a related method thereof are proposed to solve the above-mentioned problem.

According to a first aspect of the present invention, an exemplary digital-to-analog conversion apparatus is disclosed. The exemplary digital-to-analog conversion apparatus includes a first digital-to-analog converter, at least one second digital-to-analog converter, and a combining circuit. The first digital-to-analog converter is arranged to receive a first sampling clock and a digital input, and convert the digital input into a first analog output according to the first sampling clock. The at least one second digital-to-analog converter is arranged to receive the digital input and at least one second sampling clock different from the first sampling clock, and convert the digital input into at least one second analog output according to the at least one second sampling clock. The combining circuit is arranged to combine the first analog output and the at least one second analog output into a combined analog output of the digital input.

According to a second aspect of the present invention, an exemplary digital-to-analog conversion method is disclosed. The exemplary digital-to-analog conversion method includes: performing a first digital-to-analog conversion operation upon a digital input based on a first sampling clock, and accordingly generating a first analog output; performing at least one second digital-to-analog conversion operation upon the digital input based on at least one second sampling clock different from the first sampling clock, and accordingly generating at least one second analog output; and combining the first analog output and the at least one second analog output into a combined analog output of the digital input.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The main concept of the present invention is to generate a combined analog output representative of a digital input by combining analog outputs derived from using different sampling clocks (e.g., sampling clocks having the same frequency but different phases). Concerning the combined analog output, at least the images around the sampling frequency (i.e., first-order images) can be effectively attenuated by a transfer function resulting from combining the analog outputs derived from using different sampling clocks. Hence, with the help of the intentionally introduced transfer function which offers needed image rejection, a post-DAC filter is allowed to be implemented using a lower-order filter such as a first-order low-pass filter (LPF). Further description of the proposed image-rejection DAC architecture is detailed as below.

Figure 1:
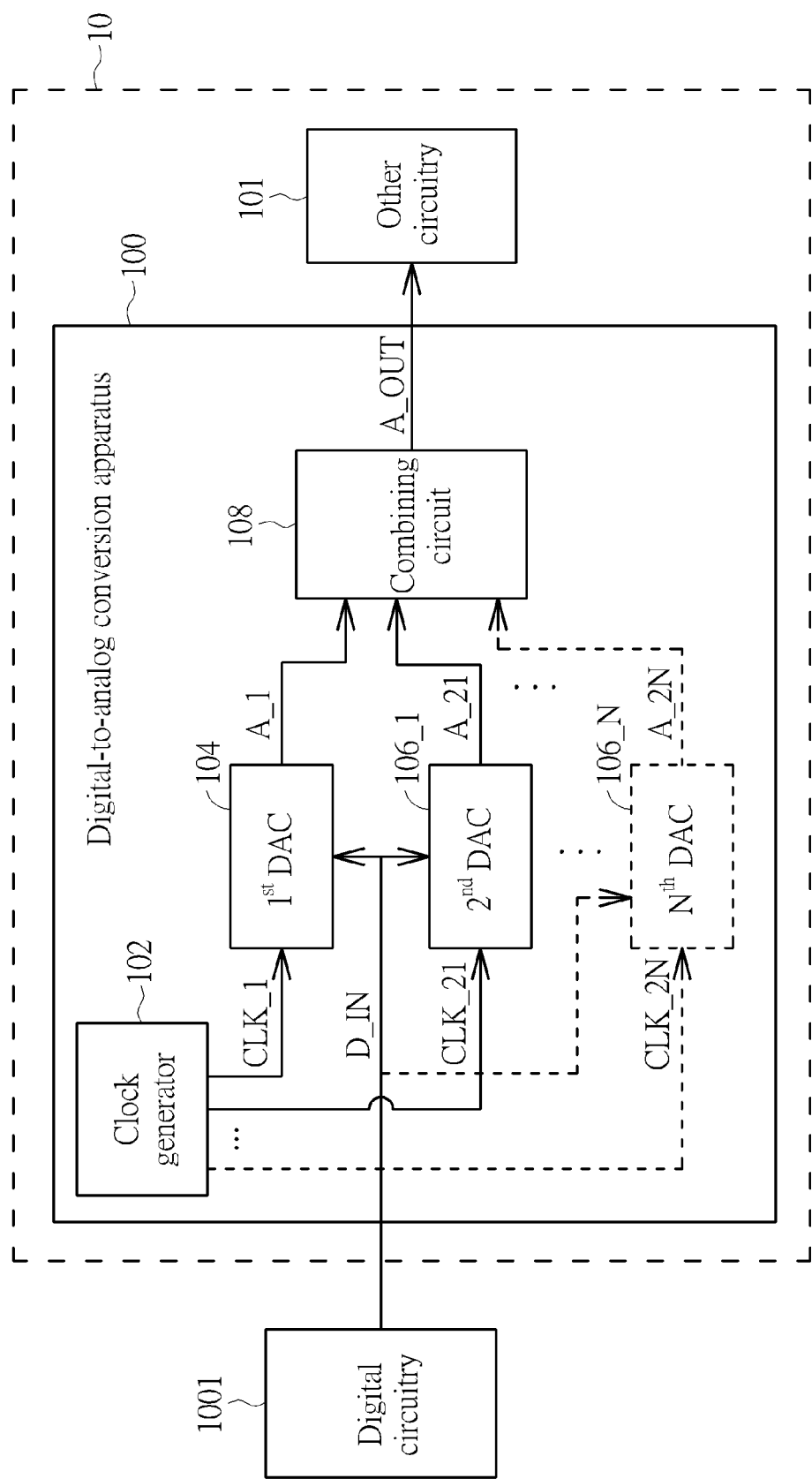
FIG. 1 is a block diagram illustrating the generalized architecture of a digital-to-analog conversion apparatus according to an embodiment of the present invention.

FIG. 1 is a block diagram illustrating the generalized architecture of a digital-to-analog conversion apparatus according to an embodiment of the present invention. The digital-to-analog conversion apparatus 100 may be used by any application which requires the function of converting an input signal in a digital domain into an output signal in an analog domain. By way of example, the digital-to-analog conversion apparatus 100 may be implemented in a wireless transmitter 10. That is, the digital-to-analog conversion apparatus 100 is part of the wireless transmitter 10, and the wireless transmitter 10 further includes other circuitry 101 needed to accomplish the task of transmitting a wireless signal (i.e., a radio frequency (RF) signal) over the air. It should be noted that using the digital-to-analog conversion apparatus 100 in the wireless transmitter 10 is for illustrative purposes only, and is not meant to be a limitation of the present invention. Hence, any electronic device using the proposed digital-to-analog conversion architecture falls within the scope of the present invention.

The digital circuitry 1001 is a function block preceding the digital-to-analog conversion apparatus 100, and generates a digital input D_IN to the digital-to-analog conversion apparatus 100. With regard to the digital-to-analog conversion apparatus 100, it includes, but not limited to, a clock generator 102, a first digital-to-analog converter (DAC) 104, at least one second DAC 106_1 (or 106_1-106_N), and a combining circuit 108. The clock generator 102 is arranged to generate a plurality of different sampling clocks, including a first sampling clock CLK_1 and at least one second sampling clock CLK_21 (or CLK_21-CLK_2N), to the first DAC 104 and the at least one second DAC 106_1 (or 106_1-106_N), respectively. More specifically, when the digital-to-analog conversion apparatus 100 is configured to have one first DAC (i.e., one main DAC) 104 and one second DAC (i.e., one auxiliary DAC) 106_1 only, the clock generator 102 generates one first sampling clock CLK_1 to the first DAC 104, and generates one second sampling clock CLK_21 to the second DAC 106_1. Alternatively, when the digital-to-analog conversion apparatus 100 is configured to have one first DAC (i.e., one main DAC) 104 and multiple second DACs (i.e., multiple auxiliary DACs) 106_1-106_N (N is a positive integer larger than 1), the clock generator 102 generates one first sampling clock CLK_1 to the first DAC 104, and further generates a plurality of second sampling clocks CLK_21-CLK_2N to the second DACs 106_1-106_N, respectively. The first DAC 104 is arranged to receive the first sampling clock CLK_1 and the digital input DIN, and convert the digital input D_IN into a first analog output A_1 according to the first sampling clock CLK_1. The at least one second DAC 106_1 (or 106_1-106_N) is arranged to receive the same digital input D_IN and at least one second sampling clock CLK_21 (or CLK_21-CLK_2N) different from the first sampling clock CLK_1, and convert the digital input D_IN into at least one second analog output A_21 (or A_21-A_2N) according to the at least one second sampling clock CLK_21 (or CLK_21-CLK_2N). The combining circuit 108 is coupled to the first DAC 104 and the at least one second DAC 106_1 (or 106_1-106_N), and arranged to combine the first analog output A_1 and the at least one second analog output A_21 (or A_21-A_2N) into the combined analog output A_OUT. The at least one second DAC 106_1 (or 106_1-106_N) may have a duplicate circuit structure of the first DAC 104 while only their sampling clock inputs are different. Since the same digital input is converted into multiple DAC outputs based on different phase sampling clocks, the combination of multiple DAC outputs in the combining circuit 108 would introduce needed filter characteristics for image rejection. Hence, with a proper design of the sampling clocks, the undesired image interferences (e.g., at least the unwanted images around a working frequency) can be attenuated when the combined analog output A_OUT is generated. Moreover, since the combination of multiple DAC outputs in the combining circuit 108 would introduce needed filter characteristics, the requirement of a post-DAC filter can be relaxed. For example, a first-order low-pass filter (LPF) may be employed to reduce the filter design complexity as well as the production cost. In a preferred embodiment, the combining circuit 108 is further arranged to apply first-order low-pass filtering when generating the combined analog output A_OUT. For example, the combining circuit 108 includes or is implemented using a transimpedance amplifier which also acts as a post-DAC filter.

For better understanding of technical features of the present invention, several exemplary digital-to-analog conversion apparatuses, each using the proposed image-rejection DAC architecture shown in FIG. 1, are discussed as below.

Figure 2:
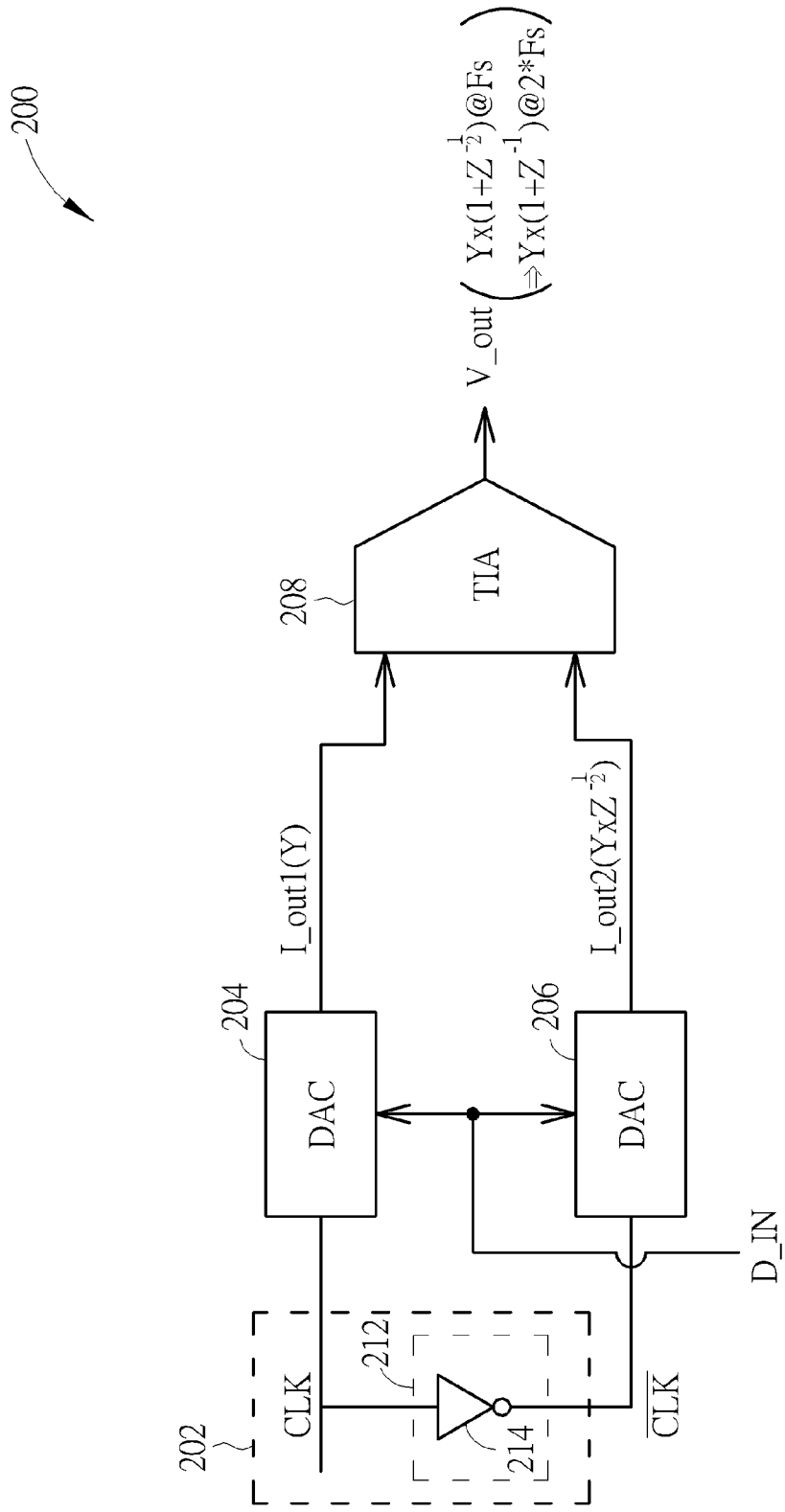
FIG. 2 is a diagram illustrating one digital-to-analog conversion apparatus using the proposed image-rejection DAC architecture shown in FIG. 1 according to an embodiment of the present invention.

Please refer to FIG. 2, which is a diagram illustrating one digital-to-analog conversion apparatus using the proposed image-rejection DAC architecture shown in FIG. 1 according to an embodiment of the present invention. Based on the proposed image-rejection DAC architecture shown in FIG. 1, the exemplary digital-to-analog conversion apparatus 200 includes a clock generator 202, a plurality of digital-to-analog converters (e.g., TXDACs) 204, 206, and a transimpedance amplifier (TIA) 208. The clock generator 102 shown in FIG. 1 is implemented using the clock generator 202 having a clock processing circuit 212 included therein. The clock generator 202 may have an internal clock source (not shown) for generating a sampling clock CLK with a sampling frequency Fs (e.g., 900 MHz), or may just receive the sampling clock CLK with the sampling frequency Fs from an external clock source (not shown). The clock processing circuit 212 is arranged to receive the sampling clock CLK, and generate another sampling clock by processing the sampling clock CLK. In this embodiment, the clock processing circuit 212 includes an inverter 214 used to invert the sampling clock CLK to thereby generate another sampling clock $\overline{CLK}$, where the sampling clocks CLK and $\overline{CLK}$ have the same frequency (i.e., Fs) but different phases. More specifically, due to the inherent characteristics of the inverter 214, there is a 180-degree phase difference between the sampling clocks CLK and $\overline{CLK}$. In this embodiment, the sampling clock CLK acts as the first sampling clock CLK_1 shown in FIG. 1, and is fed into the DAC 204 that acts as the first DAC 104 shown in FIG. 1; and the sampling clock $\overline{CLK}$ acts as the second sampling clock CLK_21 shown in FIG. 1, and is fed into the DAC 206 that acts as the second DAC 106_1 shown in FIG. 1.

In this embodiment, each of the DACs 204, 206 is a current output DAC. Hence, the DAC (e.g., a K-bit TXDAC) 204 converts the digital input (e.g., one K-bit data) D_IN based on the sampling clock CLK, thereby generating a current output I_out1 as the first analog output A_1 shown in FIG. 1; and the DAC (e.g., a K-bit TXDAC) 206 converts the same digital input (e.g., the same K-bit data) D_IN based on the sampling clock $\overline{\text{CLK}}$, thereby generating a current output I_out2 as the second analog output A_21 shown in FIG. 1. The combining circuit 108 shown in FIG. 1 is implemented using a current-to-voltage converter such as the TIA 208. Hence, the current outputs I_out1 and I_out2 are both fed into input ports of the TIA 208, and a voltage output V_out (which acts as the combined analog output A_OUT shown in FIG. 1) is generated from the TIA 208 based on a summation of the current outputs I_out1 and I_out2. As the voltage output V_out is derived from the summation of two current outputs I_out1 and I_out2, the direct-current (DC) gain of the TIA 208 may be adjusted to make a DC level of the voltage output V_out (which is derived from one main DAC output and one auxiliary DAC output) maintained at a DC level of a voltage output solely derived from the main DAC output. However, this is not meant to be a limitation of the present invention. In an alternative design, the DC level adjustment may be realized in circuit element (s) following the TIA 208.

In the Z-transform domain, the current output I_out1 may be represented by Y, and the current output I_out2 may be represented by $Y \times Z^{-1/2}$ due to a 180-degree phase delay caused by the inverter 214. If the transfer function possessed by the TIA 208 is not taken into consideration, the voltage output V_out may be simply represented by $Y \times (1+Z^{-1/2})$. It should be noted that the transfer function $(1+Z^{-1/2})$ at the target sampling frequency Fs is equivalent to a transfer function $(1+Z^{-1})$ at a higher sampling frequency 2*Fs. Thus, the DAC architecture shown in FIG. 2 may be conceptually regarded as operating under a higher sampling frequency 2*Fs and having a filter embedded therein.

Figure 3:
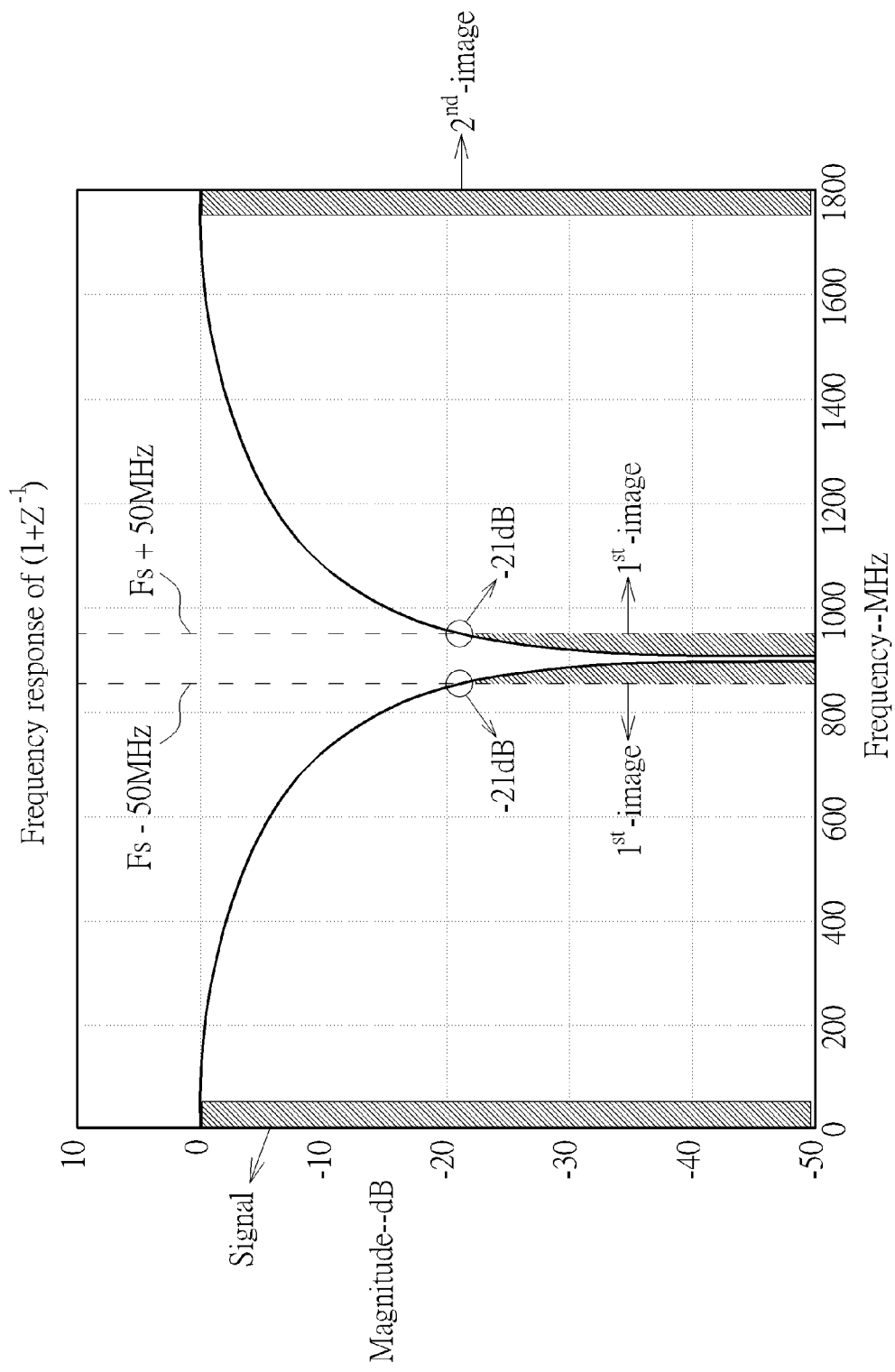
FIG. 3 is a diagram illustrating a frequency response of a transfer function $(1+Z^{-1})$ at 2*Fs.

The conceptual filter introduced by the intentionally created transfer function $(1+Z^{-1})$ is able to apply image rejection to the combined analog output of the digital-to-analog conversion apparatus 200. FIG. 3 is a diagram illustrating a frequency response of the transfer function $(1+Z^{-1})$ at 2*Fs. Suppose that the signal bandwidth BW of the digital input D_IN is 50 MHz and the sampling frequency Fs is 900 MHz. In general, images are located at L*Fs+M*BW, where L is the order of the harmonic, and M=+/−1. As shown in FIG. 3, the $1^{st}$-images are located at 850 MHz and 950 MHz, respectively. Besides, the filter $(1+Z^{-1})$ is able to attenuate the $1^{st}$-images around the sampling frequency Fs. As combining current outputs I_out1 and I_out2 derived from using out-of-phase sampling clocks is equivalent to a filter with the transfer function $(1+Z^{-1})$ for providing enough attenuation for images around the sampling frequency Fs, the requirement of a post-DAC filter can be relaxed. For example, in one exemplary design, the TIA 208 is further configured to act as a low-pass filter, especially, a wide bandwidth (e.g., 100 MHz) low-pass filter with a lower order (e.g., first order).

Figure 4:
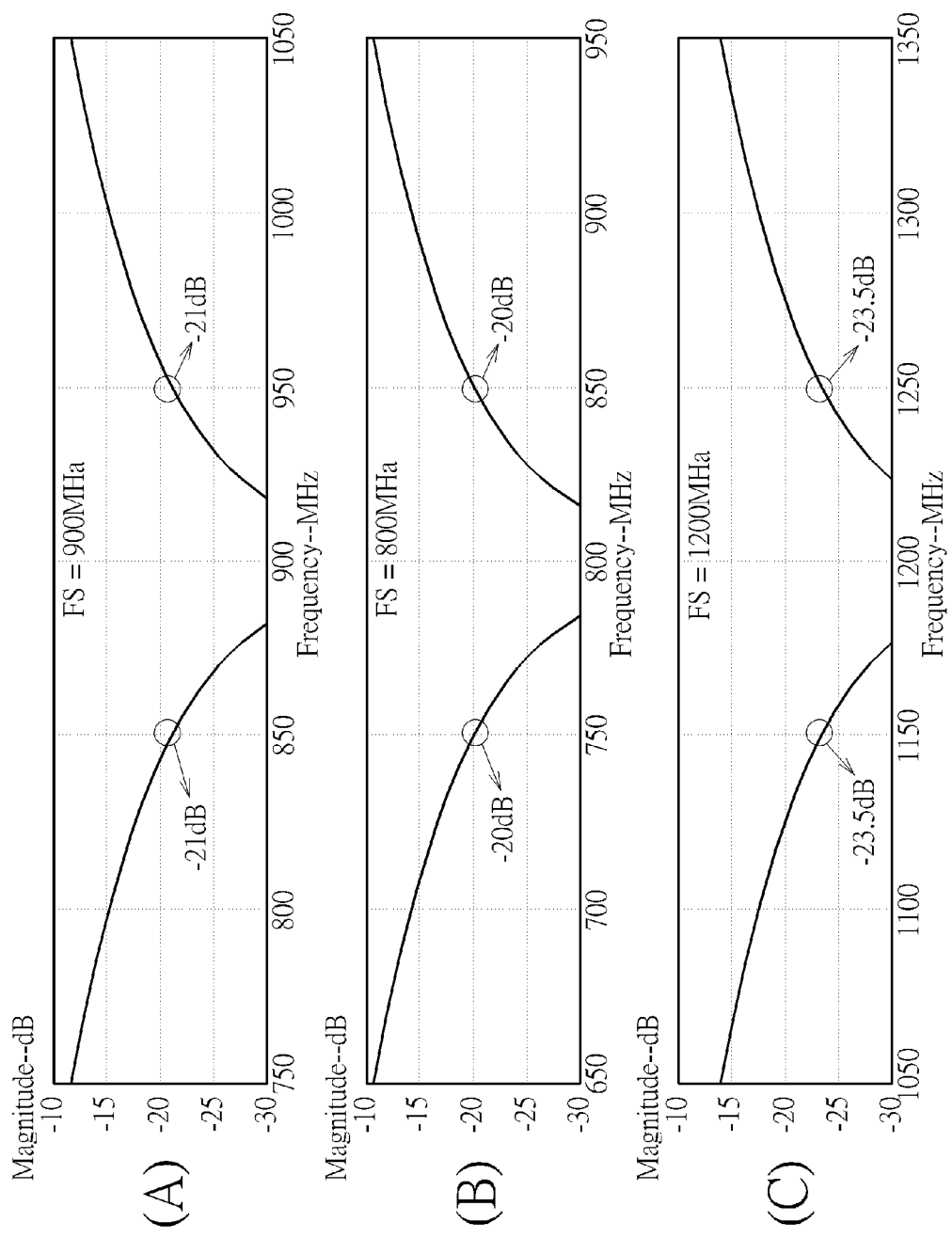
FIG. 4 is a diagram illustrating frequency responses of the transfer function $(1+Z^{-1})$ when the digital-to-analog conversion apparatus operates under different sampling frequencies.

In above example, the digital-to-analog conversion apparatus 200 is able to provide enough attenuation for the $1^{st}$-images around the sampling frequency of 900 MHz. It should be noted that there is no limitation on the value of the sampling frequency used by the digital-to-analog conversion apparatus 200. That is, when DACs 204, 206 of the digital-to-analog conversion apparatus 200 are operated under a different sampling frequency, the same objective of applying image rejection to the TIA output through combining the DAC outputs is achieved. Please refer to FIG. 4, which is a diagram illustrating frequency responses of the transfer function $(1+Z^{-1})$ when the digital-to-analog conversion apparatus 200 operates under different sampling frequencies (e.g., Fs=900 MHz, Fs=800 MHz, and Fs=1200 MHz). As can be readily known from FIG. 4, the $1^{st}$-images can be effectively attenuated through the proposed image-rejection DAC architecture, regardless of the sampling frequency Fs used.

Figure 5:
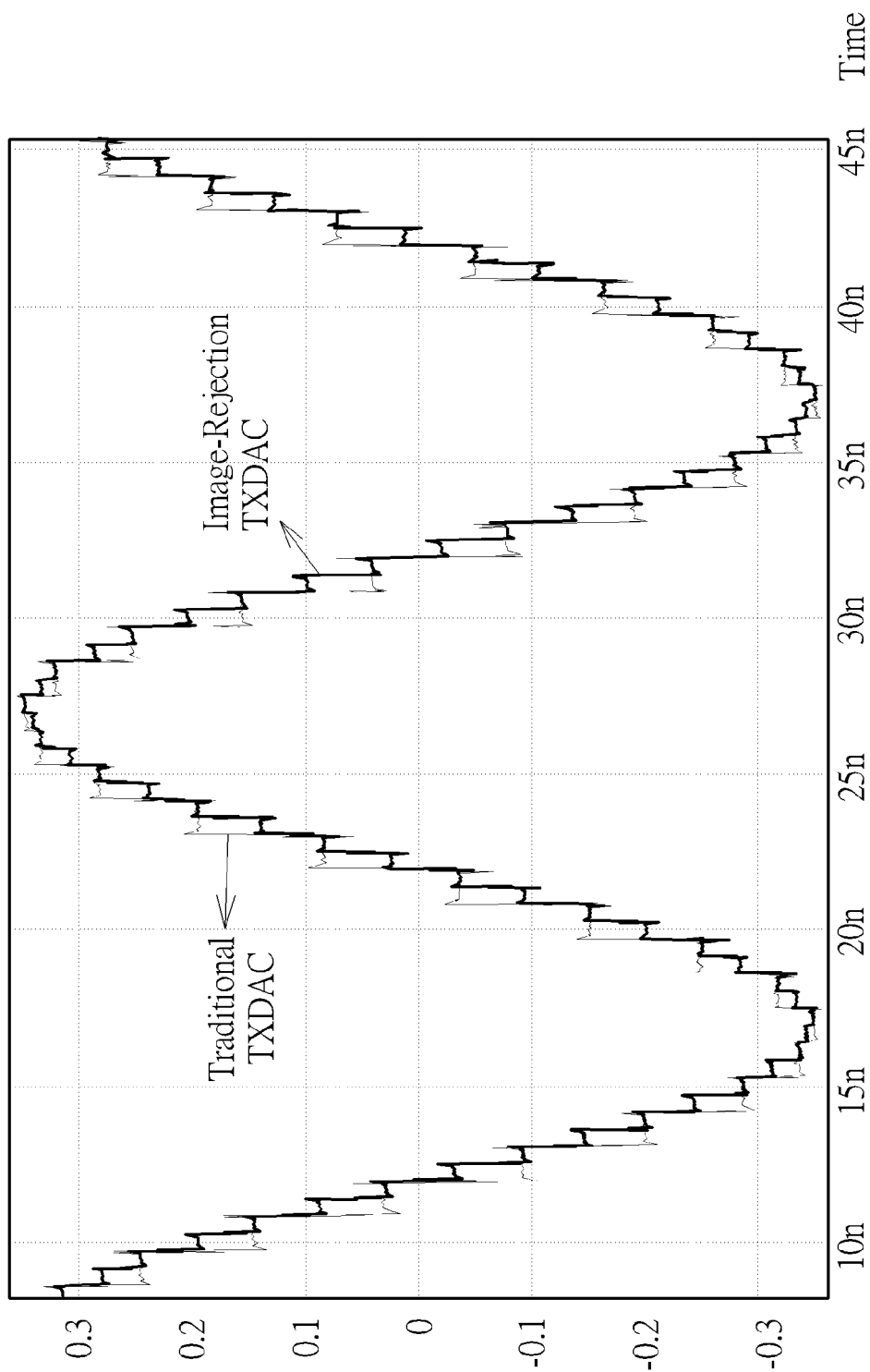
FIG. 5 is a diagram illustrating time-domain waveforms of the conventional DAC design and the proposed DAC design with image rejection according to an embodiment of the present invention.
Figure 6:
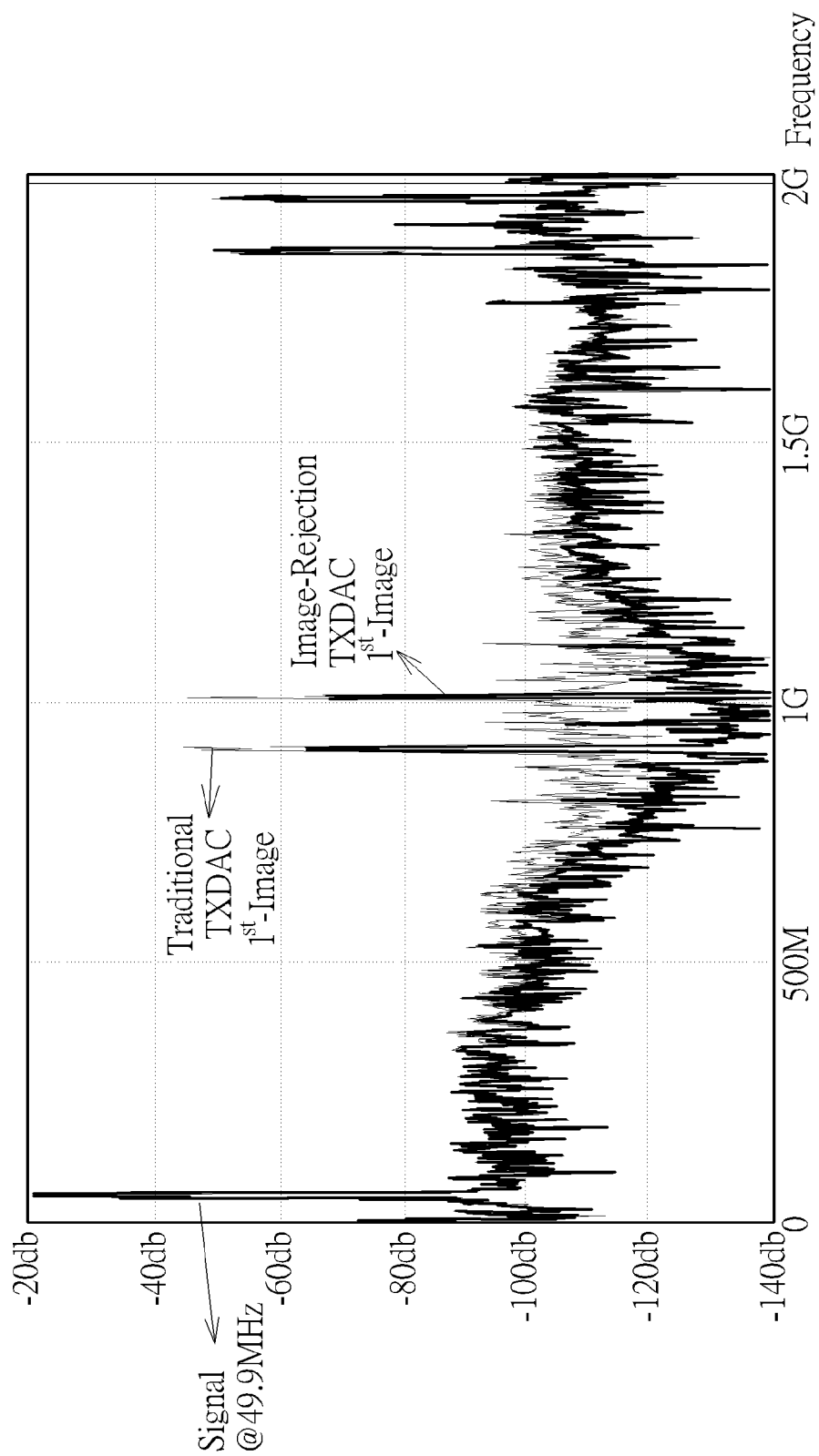
FIG. 6 is a diagram illustrating frequency-domain waveforms of the conventional DAC design and the proposed DAC design with image rejection according to an embodiment of the present invention.

To put it simply, compared to a conventional DAC design with a DAC output suffering from unwanted images around the working frequency, the proposed DAC architecture is capable of providing enough attenuation to images around the working frequency (even though there is no post-DAC filter used). The comparison between the conventional DAC design and the proposed DAC design with image rejection according to the afore-mentioned embodiment is illustrated in FIG. 5 and FIG. 6. FIG. 5 is a diagram illustrating time-domain waveforms of the conventional DAC design and the proposed DAC design with image rejection according to the afore-mentioned embodiment. FIG. 6 is a diagram illustrating frequency-domain waveforms of the conventional DAC design and the proposed DAC design with image rejection according to the afore-mentioned embodiment. Compared to the time-domain waveform of the conventional DAC design, the time-domain waveform of the proposed DAC design with image rejection has a reduced amplitude change rate, thus having less high-frequency noise. Hence, as can be seen from FIG. 6, magnitudes of $1^{st}$-images around the sampling frequency Fs (Fs=900 MHz) of the proposed DAC design are lower than that of $1^{st}$-images around the sampling frequency Fs (Fs=900 MHz) of the conventional DAC design.

In above embodiment, only one auxiliary DAC (i.e., DAC 206) with a phase-adjusted analog output is added to create noise suppression of images around the sampling frequency. Alternatively, multiple auxiliary DACs with different phase-adjusted analog outputs may be added to create noise suppression of images around the sampling frequency and higher-order harmonic frequencies.

Figure 7:
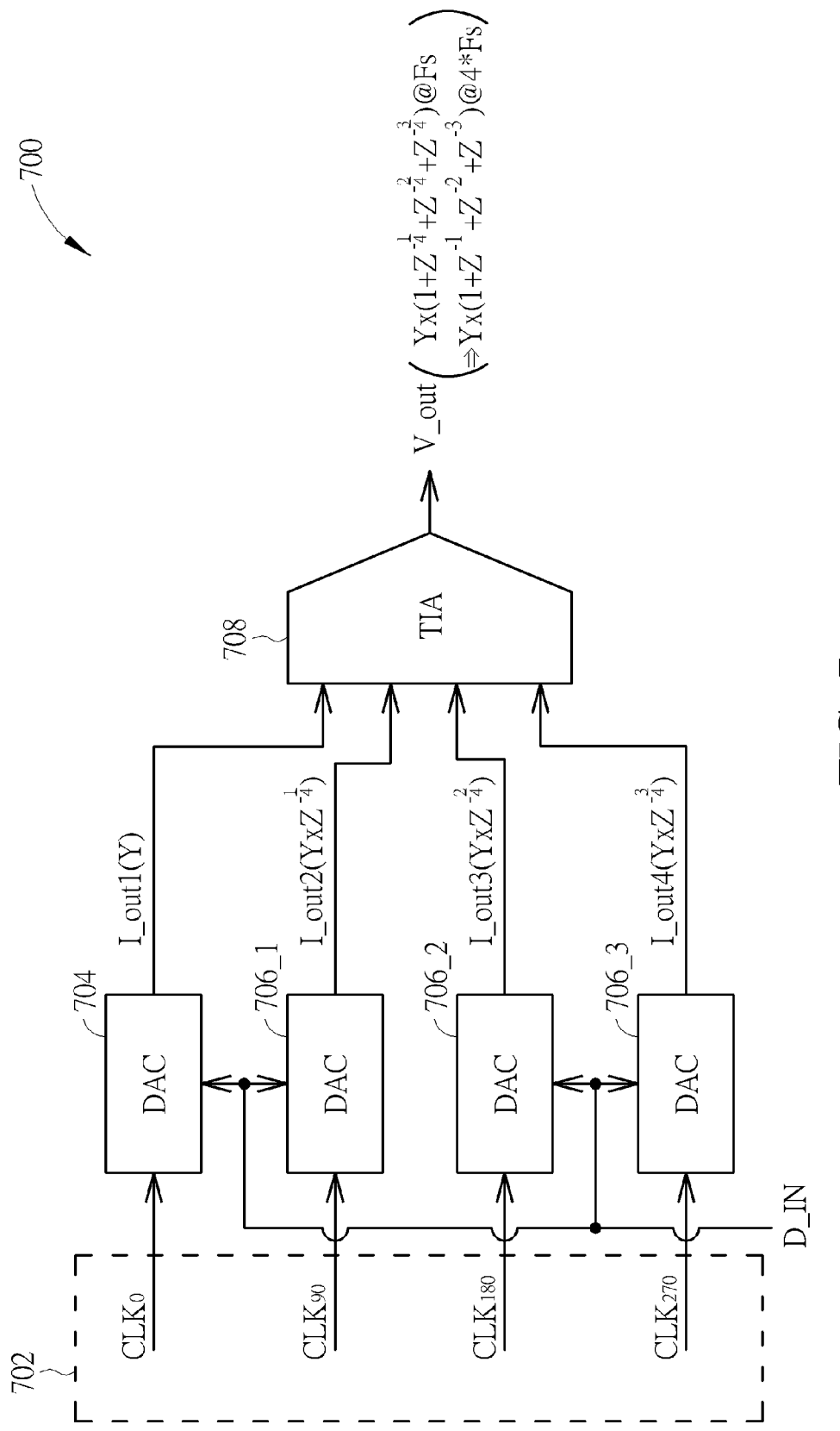
FIG. 7 is a diagram illustrating another digital-to-analog conversion apparatus using the proposed image-rejection DAC architecture shown in FIG. 1 according to an embodiment of the present invention.

Please refer to FIG. 7, which is a diagram illustrating another digital-to-analog conversion apparatus using the proposed image-rejection DAC architecture shown in FIG. 1 according to an embodiment of the present invention. Based on the same proposed image-rejection DAC architecture shown in FIG. 1, the exemplary digital-to-analog conversion apparatus 700 includes a clock generator 702, a plurality of digital-to-analog converters (e.g., TXDACs) 704, 706_1, 706_2, 706_3, and a transimpedance amplifier (TIA) 708. The clock generator 102 shown in FIG. 1 is implemented using the clock generator 702. By way of example, the clock generator 702 may be a multi-phase clock generator capable of generating a plurality of sampling clocks $CLK_0$, $CLK_{90}$, $CLK_{180}$, $CLK_{270}$ with different phases equally spaced. Specifically, the sampling clock $CLK_{90}$ has a phase delay equal to 90° as compared to the sampling clock $CLK_0$, the sampling clock $CLK_{180}$ has a phase delay equal to 180° as compared to the sampling clock $CLK_0$, and the sampling clock $CLK_{270}$ has a phase delay equal to 270° as compared to the sampling clock $CLK_0$. The sampling clocks $CLK_0$, $CLK_{90}$, $CLK_{180}$, $CLK_{270}$ have the same sampling frequency Fs (e.g., 900 MHz) but different phases. The sampling clock $CLK_0$ acts as the first sampling clock CLK_1 shown in FIG. 1, and is fed into the DAC 704 that acts as the first DAC 104 shown in FIG. 1; and the sampling clocks $CLK_{90}$, $CLK_{180}$, $CLK_{270}$ act as the second sampling clocks CLK_21-CLK_2N shown in FIG. 1, and are fed into DACs 706_1-706_3 that act as the second DACs 106_1-106_N shown in FIG. 1, respectively.

In this embodiment, each of the DACs 704, 706_1-706_3 is a current output DAC. Hence, the DAC (e.g., a K-bit TXDAC)

704 converts the digital input (e.g., one K-bit data) D_IN based on the sampling clock $CLK_0$, thereby generating a current output I_out1 as the first analog output A_1 shown in FIG. 1; and the DACs (e.g., K-bit TXDACs) 706_1-706_3 convert the same digital input (e.g., the same K-bit data) D_IN based on respective sampling clocks $CLK_{90}$, $CLK_{180}$, $CLK_{270}$, thereby generating a plurality of current outputs I_out2, I_out3, I_out4 as the second analog outputs A_21-A_2N shown in FIG. 1. The combining circuit 108 shown in FIG. 1 is implemented using a current-to-voltage converter such as the TIA 708. Hence, the current outputs I_out1-I_out4 are all fed into input ports of the TIA 708, and a voltage output V_out (which acts as the combined analog output A_OUT shown in FIG. 1) is generated from the TIA 708 based on a summation of the current outputs I_out1-I_out4. As the voltage output V_out is derived from the summation of four current outputs I_out1-I_out4, the DC gain of the TIA 708 may be adjusted to make a DC level of the voltage output V_out (which is derived from one main DAC output and three auxiliary DAC outputs) maintained at a DC level of a voltage output solely derived from the main DAC output. However, this is not meant to be a limitation of the present invention. In an alternative design, the DC level adjustment may be realized in circuit element (s) following the TIA 708.

In the Z-transform domain, the current output I_out1 may be represented by Y, the current output I_out2 may be represented by $Y \times Z^{-1/4}$ due to a 90-degree phase delay, the current output I_out3 may be represented by $Y \times Z^{-2/4}$ due to a 180-degree phase delay, and the current output I_out4 may be represented by $Y \times Z^{-3/4}$ due to a 270-degree phase delay. If the transfer function possessed by the TIA 708 is not taken into consideration, the voltage output V_out may be simply represented by $Y \times (1+Z^{-1/4}+Z^{-2/4}+Z^{-3/4})$. It should be noted that the transfer function $(1+Z^{-1/4}+Z^{-2/4}+Z^{-3/4})$ at the target sampling frequency Fs is equivalent to a transfer function $(1+Z^{-1}+Z^{-2}+Z^{-3})$ at a higher sampling frequency 4*Fs. Thus, the DAC architecture shown in FIG. 7 may be conceptually regarded as operating under a higher sampling frequency 4*Fs and having a filter embedded therein.

Figure 8:
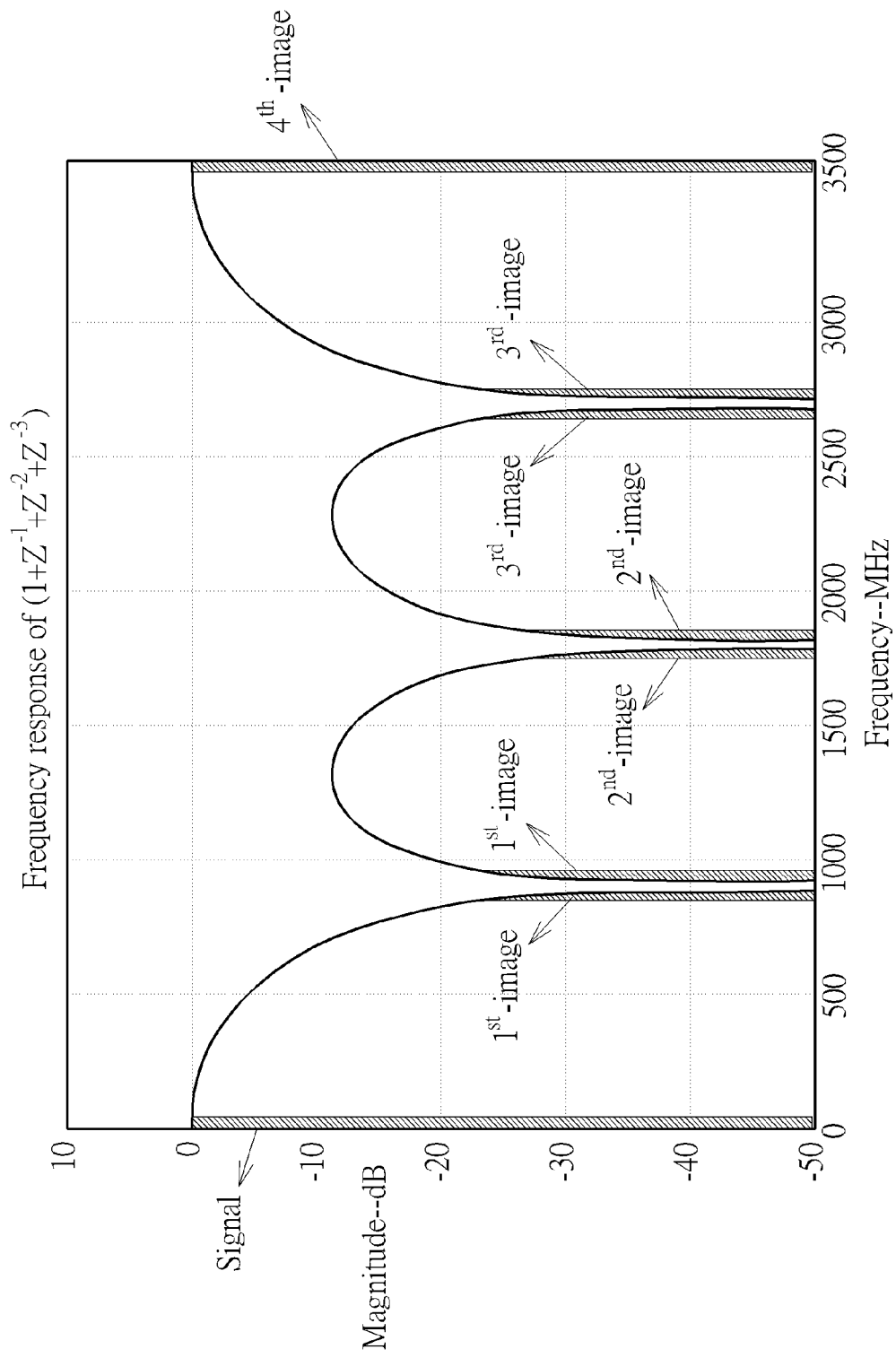
FIG. 8 is a diagram illustrating a frequency response of a transfer function $(1+Z^{-1}+Z^{-2}+Z^{-3})$ at 4*Fs.

The conceptual filter introduced by the intentionally created transfer function $(1+Z^{-1}+Z^{-2}+Z^{-3})$ is able to apply image rejection to the combined analog output of the digital-to-analog conversion apparatus 700. Please refer to FIG. 8, which is a diagram illustrating a frequency response of the transfer function $(1+Z^{-1}+Z^{-2}+Z^{-3})$ at 4*Fs. Suppose that the signal bandwidth BW of the digital input D_IN is 50 MHz and the sampling frequency Fs is 900 MHz. As mentioned above, images are located at L*Fs+M*BW, where L is the order of the harmonic, and M=+/−1. As shown in FIG. 8, the $1^{st}$-images are located at 850 MHz and 950 MHz, respectively; the $2^{nd}$-images are located at 1750 MHz and 1850 MHz, respectively; and the $3^{rd}$-images are located at 2650 MHz and 2750 MHz, respectively. The filter $(1+Z^{-1}+Z^{-2}+Z^{-3})$ is able to attenuate the $1^{st}$-images around the sampling frequency Fs, attenuate the $2^{nd}$-images around the second harmonic frequency 2*Fs, and attenuate the $3^{rd}$-images around the third harmonic frequency 3*Fs. As combining current outputs I_out1-I_out4 derived from using sampling clocks with equally-spaced phases is equivalent to a filter with the transfer function $(1+Z^{-1}+Z^{-2}+Z^{-3})$ for providing enough attenuation for images around frequencies Fs, 2*Fs, 3*Fs, the requirement of a post-DAC filter can be relaxed. For example, in one exemplary design, the TIA 708 is further configured to act as a low-pass filter, especially, a wide bandwidth (e.g., 100 MHz) low-pass filter with a lower order (e.g., first order).

In summary, the proposed image-rejection DAC architecture is capable of offering good image rejection while using a lower-order post-DAC filter. In this way, the filter design complexity and the production cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog conversion apparatus, comprising:
a first digital-to-analog converter, arranged to receive a first sampling clock and a digital input, and convert the digital input into a first analog output according to the first sampling clock;
at least one second digital-to-analog converter, arranged to receive the digital input and at least one second sampling clock different from the first sampling clock, and convert the digital input into at least one second analog output according to the at least one second sampling clock; and
a combining circuit, arranged to combine the first analog output and the at least one second analog output into a combined analog output of the digital input;
wherein the same digital input is received by the first digital-to-analog converter and the at least one second digital-to-analog converter; and the same digital input received by the first digital-to-analog converter and the at least one second digital-to-analog converter is converted into the first analog output and the at least one second analog output according to the first sampling clock and the at least one second sampling clock, respectively.

2. The digital-to-analog conversion apparatus of claim 1, wherein a frequency of the first sampling clock is identical to a frequency of the at least one second sampling clock, and a phase of the first sampling clock is different from a phase of the at least one second sampling clock.

3. The digital-to-analog conversion apparatus of claim 2, wherein the at least one second digital-to-analog converter includes a plurality of second digital-to-analog converters, the at least one second sampling clock includes a plurality of second sampling clocks used by the second digital-to-analog converters respectively, and the second sampling clocks have a same frequency but different phases.

4. The digital-to-analog conversion apparatus of claim 3, wherein phases of the first sampling clock and the second sampling clocks are equally spaced.

5. The digital-to-analog conversion apparatus of claim 1, further comprising:
a clock processing circuit, arranged to receive the first sampling clock, and generate the at least one second sampling clock by processing the first sampling clock.

6. The digital-to-analog conversion apparatus of claim 5, wherein the clock generating circuit is arranged to adjust a phase of the first sampling clock to generate the at least one second sampling clock.

7. The digital-to-analog conversion apparatus of claim 5, wherein the clock generating circuit is an inverter.

8. The digital-to-analog conversion apparatus of claim 1, wherein the combining circuit is further arranged to apply first-order low-pass filtering when generating the combined analog output.

9. The digital-to-analog conversion apparatus of claim 1, wherein each of the first digital-to-analog converter and the at least one second digital-to-analog converter is a current output digital-to-analog converter, and the combining circuit comprises a transimpedance amplifier.

10. A digital-to-analog conversion method, comprising:
performing a first digital-to-analog conversion operation upon a digital input based on a first sampling clock, and accordingly generating a first analog output;
performing at least one second digital-to-analog conversion operation upon the digital input based on at least one second sampling clock different from the first sampling clock, and accordingly generating at least one second analog output; and
combining the first analog output and the at least one second analog output into a combined analog output of the digital input;
wherein the same digital input is received by the first digital-to-analog conversion operation and the at least one second digital-to-analog conversion operation; and the same digital input received by the first digital-to-analog conversion operation and the at least one second digital-to-analog conversion operation is converted into the first analog output and the at least one second analog output according to the first sampling clock and the at least one second sampling clock, respectively.

11. The digital-to-analog conversion method of claim 10, wherein a frequency of the first sampling clock is identical to a frequency of the at least one second sampling clock, and a phase of the first sampling clock is different from a phase of the at least one second sampling clock.

12. The digital-to-analog conversion method of claim 11, wherein the at least one second digital-to-analog conversion operations includes a plurality of second digital-to-analog conversion operations, the at least one second sampling clock includes a plurality of second sampling clocks used by the second digital-to-analog conversion operations respectively, and the second sampling clocks have a same frequency but different phases.

13. The digital-to-analog conversion method of claim 12, wherein phases of the first sampling clock and the second sampling clocks are equally spaced.

14. The digital-to-analog conversion method of claim 10, further comprising:
generating the at least one second sampling clock by processing the first sampling clock.

15. The digital-to-analog conversion method of claim 14, wherein the step of generating the at least one second sampling clock comprises:
adjusting a phase of the first sampling clock to generate the at least one second sampling clock.

16. The digital-to-analog conversion method of claim 14, wherein the step of adjusting the phase of the first sampling clock comprises:
inverting the first sampling clock to generate the at least one second sampling clock.

17. The digital-to-analog conversion method of claim 10, wherein the step of combining the first analog output and the at least one second analog output comprises:
performing first-order low-pass filtering when generating the combined analog output.

18. The digital-to-analog conversion method of claim 10, wherein each of the first analog output and the at least one second analog output is a current output, and the step of combining the first analog output and the at least one second analog output comprises:
utilizing a transimpedance amplifier to receive the first analog output and the at least one second analog output, and generate the combined analog output corresponding to the first analog output and the at least one second analog output.

* * * * *